United States Patent
Brask et al.

(10) Patent No.: US 6,869,889 B1
(45) Date of Patent: Mar. 22, 2005

(54) ETCHING METAL CARBIDE FILMS

(75) Inventors: Justin K. Brask, Portland, OR (US);
Jack Kavalieros, Portland, OR (US);
Mark L. Doczy, Beaverton, OR (US);
Matthew V. Metz, Hillsboro, OR (US);
Suman Datta, Beaverton, OR (US);
Uday Shah, Portland, OR (US);
Terence Bacuita, Hillsboro, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/819,789

(22) Filed: Apr. 7, 2004

(51) Int. Cl.[7] ............................................. H01L 21/302
(52) U.S. Cl. ...................... 438/746; 438/690; 438/754; 216/90; 216/100
(58) Field of Search ................................. 438/746, 754, 438/690; 216/90, 100

(56) References Cited

U.S. PATENT DOCUMENTS

| | | | | |
|---|---|---|---|---|
| 5,057,184 A | * | 10/1991 | Gupta et al. | .................. 216/65 |
| 5,245,187 A | * | 9/1993 | Kawase et al. | ............. 250/306 |
| 6,303,508 B1 | * | 10/2001 | Alok | ........................... 438/705 |
| 6,375,752 B1 | * | 4/2002 | Otsuki et al. | .................. 134/1 |
| 6,407,014 B1 | * | 6/2002 | Alok | ........................... 438/705 |

OTHER PUBLICATIONS

"Effect of Ultrasonic Vibrations On the Anodic Dissolution of Hard Alloys"; Chaika, Elektronnaya Obrabotka Materialov; (1970); (23); abstract only.*

* cited by examiner

Primary Examiner—George A. Goudreau
(74) Attorney, Agent, or Firm—Trop, Pruner & Hu, P.C.

(57) ABSTRACT

A metal carbide film may be etched in an etchant bath using sonication. The sonication may drive the reaction and, particularly, the gaseous byproducts in the form of carbon dioxide. Thus, the use of sonication invokes a favorable equilibrium to pattern metal carbide films, for example, for use as metal gate electrodes.

21 Claims, 2 Drawing Sheets

ETCHING METAL CARBIDE FILMS

BACKGROUND

This invention relates generally to the fabrication of integrated circuits.

Metal carbide films may be utilized in various applications in connection with integrated circuit fabrication. One possible application is as part of the gate electrode of a metal gate field effect transistor. In order to utilize the films in many semiconductor applications, they need to be etched.

Thus, there is a need for ways to etch metal carbide films.

DETAILED DESCRIPTION

Figure 1:
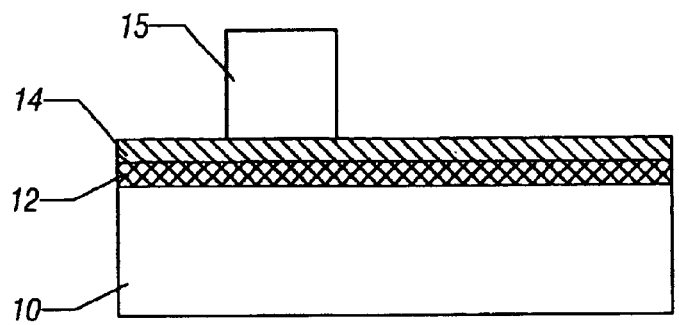
FIG. 1 is an enlarged, cross-sectional view at an early stage of manufacture in accordance with one embodiment of the present invention.

Referring to FIG. 1, a semiconductor substrate 10 may be covered by a high dielectric constant dielectric 12. As an example, the dielectric 12 may be formed of hafnium dioxide. The dielectric 12 may be covered by a metal carbide layer 14. The metal carbide layer 14 may be made of any metal carbide including carbides of titanium, zirconium, tantalum, hafnium, aluminum, ruthenium, tungsten, and nitrides of those metals. In one embodiment, the layer 14 will become the gate electrode of an n-type or p-type field effect transistor.

Figure 2:
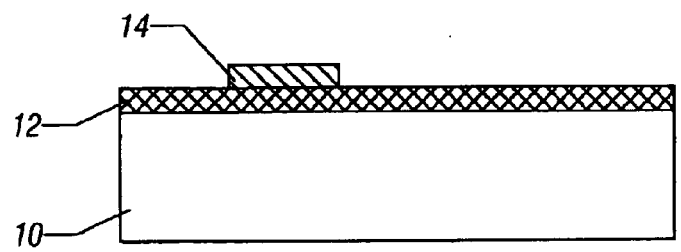
FIG. 2 is an enlarged, cross-sectional view at a subsequent stage of manufacture in accordance with one embodiment of the present invention.
Figure 3:
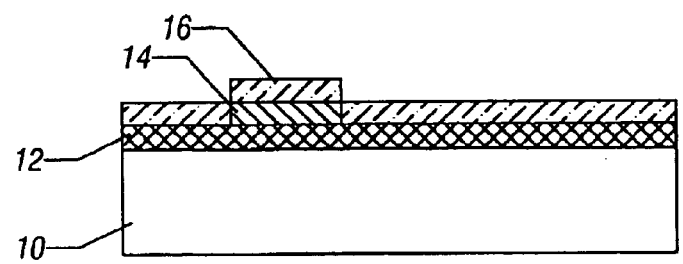
FIG. 3 is an enlarged, cross-sectional view at a subsequent stage of manufacture in accordance with one embodiment of the present invention.

The metal carbide layer 14 may be covered by a patterned etch stop layer 15 as indicated in FIG. 2. Etching may proceed down to, but not through, the dielectric 12 using the patterned etch stop layer as a mask. The structure shown in FIG. 2 may then be covered with another metal carbide layer 17 as shown in FIG. 3. The metal carbide layer 16 may be a p-type metal carbide layer, such as platinum, ruthenium, or lead carbide. However, in some embodiments, only one of the layers 14, 16 may be metal carbide.

Figure 4:
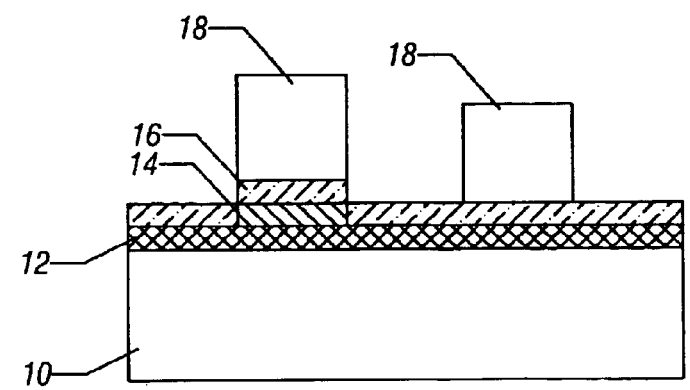
FIG. 4 is an enlarged, cross-sectional view at a subsequent stage of manufacture in accordance with one embodiment of the present invention.
Figure 5:
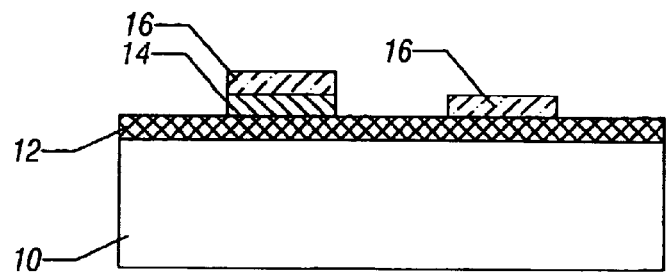
FIG. 5 is an enlarged, cross-sectional view at a subsequent stage of manufacture in accordance with one embodiment of the present invention.

Referring to FIG. 4, the layers 14 and 16, where n-type transistors will be formed, may be covered by a patterned etch stop layer 18. The layer 18 may also be patterned over the locations on the substrate 10 where the p-type transistors will be formed. Then, as shown in FIG. 5, the metal carbide layer 16 may be etched using the layer 18 as a mask. The layers 14 and 16 may be between 25 and 300 Angstroms in one embodiment.

The etching of the metal carbide layers 14 and 16 may be done in a bath of wet etchant under the application of sonic energy. The sonic energy may be ultrasonic energy in the range of 10 to 100 kilohertz or megasonic energy in the range of 0.7 to 1.3 megaHertz, in one embodiment of the present invention. The power may be from 0.5 to 5 Watts per square centimeter in one embodiment of the present invention. The wafers may be immersed in a bath of wet etching solution. In one embodiment, the etching solution may be aqua regia, which includes hydrochloric and nitric acid.

The application of sonic energy to an otherwise benign oxidative etchant/metal carbide film drives the formation and dissipation of carbon dioxide, which is the byproduct of the carbide portion of the metal carbide, invoking a favorable equilibrium to pattern the metal carbide layer for use as a metal gate electrode in one embodiment. The removal of gaseous byproducts is according to LeChatelier's Principle. When sonication is employed, gas bubbles indicating the formation of carbon dioxide in solution may be observed. The sonic energy may add the correct amount of energy to drive the following reaction:

$$TiC + 4\ HNO_3 \rightarrow TiO_2 + CO_2 + 4\ HNO_2$$

under low pH conditions. In one embodiment, the metal carbide layers 14 and 16 may be on the order of 25 to 300 Angstroms in thickness.

Figure 6:
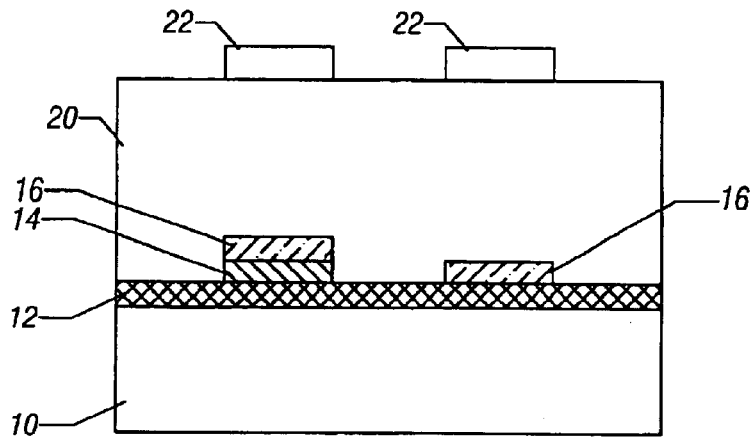
FIG. 6 is an enlarged, cross-sectional view at a subsequent stage of manufacture in accordance with one embodiment of the present invention.
Figure 7:
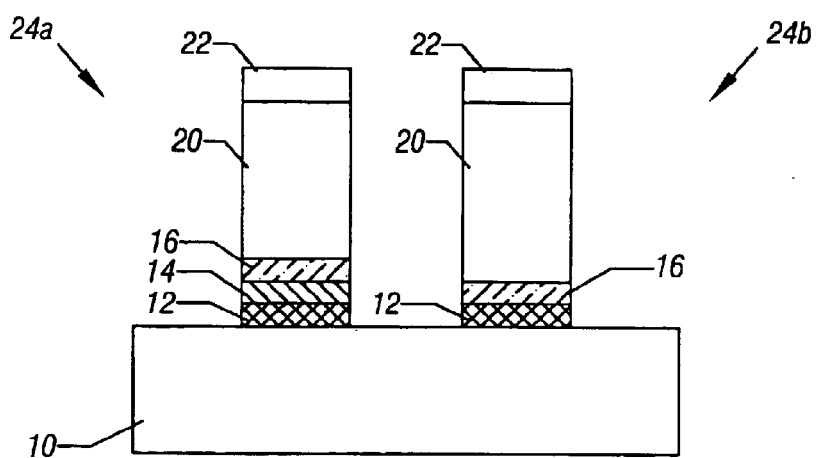
FIG. 7 is an enlarged, cross-sectional view at a subsequent stage of manufacture in accordance with one embodiment of the present invention.

After etching the layers 14 and 16, the structure may be covered by a polysilicon layer 20 as shown in FIG. 6. The layer 20 may then be covered by patterned etch stop layer 22 to etch the n-type and p-type stacks 24a and 24b, respectively, as shown in FIG. 7. Thereafter, standard fabrication processes may be utilized, including the formation of epitaxial source/drains, silicidation, and doping of polysilicon to complete the gate electrode stack.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   etching a metal carbide film in a liquid bath using sonication to form a metal gate electrode.

2. The method of claim 1 including using sonic energy in the form of ultrasonic energy.

3. The method of claim 1 including using sonic energy in the form of megasonic energy.

4. The method of claim 1 including applying sonic energy with a power between 0.5 and 5 Watts/cm$^2$.

5. The method of claim 1 including using a liquid bath of aqua regia.

6. The method of claim 1 including causing gas bubbles to appear in the liquid bath.

7. A method comprising:
   depositing a layer of a first metal carbide to form an PMOS gate electrode structure;
   depositing a layer of a second metal carbide to form a PMOS gate electrode structure; and
   patterning and etching said metal carbide layers in a liquid bath using sonication.

8. The method of claim 7 including using sonic energy in the form of ultrasonic energy.

9. The method of claim 7 including using sonic energy in the form of megasonic energy.

10. The method of claim 7 including applying sonic energy with a power between 0.5 and 5 Watts/cm$^2$.

11. The method of claim 7 including using a liquid bath of aqua regia.

12. The method of claim 7 including causing gas bubbles to appear in the liquid bath.

13. A method comprising:

forming a dielectric material;

etching, in a liquid bath with sonication, a first metal carbide layer to form a first gate electrode over said dielectric material;

forming a second metal carbide layer over said patterned first metal carbide layer; and etching said second metal carbide layer to form a part of said first metal gate electrode and to form a second metal gate electrode at spaced locations.

14. The method of claim 13 including forming a polysilicon layer over said first and second metal gate electrodes.

15. The method of claim 14 including patterning and etching said polysilicon layer over said first and second metal gate electrodes.

16. The method of claim 13 including etching said second metal carbide layer in a liquid bath with sonication.

17. The method of claim 13 including using sonic energy in the form of ultrasonic energy.

18. The method of claim 13 including using sonic energy in the form of megasonic energy.

19. The method of claim 13 including applying sonic energy with a power between 0.5 and 5 Watts/cm$^2$.

20. The method of claim 13 including using a liquid bath of aqua regia.

21. The method of claim 13 including causing gas bubbles to appear in the liquid bath.

* * * * *

UNITED STATES PATENT AND TRADEMARK OFFICE
CERTIFICATE OF CORRECTION

PATENT NO. : 6,869,889 B1
DATED : March 22, 2005
INVENTOR(S) : Justin K. Brask et al.

It is certified that error appears in the above-identified patent and that said Letters Patent is hereby corrected as shown below:

Column 2,
Line 57, "PMOS" should be -- NMOS --.

Signed and Sealed this

Twenty-fourth Day of May, 2005

JON W. DUDAS
*Director of the United States Patent and Trademark Office*